(12) United States Patent
Ota et al.

(10) Patent No.: US 7,080,680 B2
(45) Date of Patent: Jul. 25, 2006

(54) HEAT SINK, CONTROL DEVICE HAVING THE HEAT SINK AND MACHINE TOOL PROVIDED WITH THE DEVICE

(75) Inventors: Keiichiro Ota, Shimonoseki (JP); Shigeo Marugasa, Oyama (JP)

(73) Assignee: Showa Denko K.K., Tokyo (JP)

( * ) Notice: Subject to any disclaimer, the term of this patent is extended or adjusted under 35 U.S.C. 154(b) by 58 days.

(21) Appl. No.: 10/232,704

(22) Filed: Sep. 3, 2002

(65) Prior Publication Data

US 2003/0056942 A1    Mar. 27, 2003

Related U.S. Application Data

(60) Provisional application No. 60/322,439, filed on Sep. 17, 2001.

(30) Foreign Application Priority Data

Sep. 5, 2001    (JP)    ............................. 2001-268688

(51) Int. Cl.
*F28F 7/00* (2006.01)
*F28D 15/00* (2006.01)

(52) U.S. Cl. .................. 165/80.2; 165/80.3; 165/80.4; 165/104.33

(58) Field of Classification Search ................ 165/200, 165/104.26, 104.19, 104.33, 80.2, 80.3, 80.4, 165/80.5, 104.21, 274; 174/16.3, 15.2; 361/600, 361/679, 688, 700, 703, 702
See application file for complete search history.

(56) References Cited

U.S. PATENT DOCUMENTS

| | | | | |
|---|---|---|---|---|
| 3,437,132 A | * | 4/1969 | Venema | 165/80.4 |
| 4,449,580 A | * | 5/1984 | Reisman et al. | 361/702 |
| 4,478,784 A | * | 10/1984 | Burelbach | 165/274 |
| 4,583,587 A | * | 4/1986 | Alario et al. | 165/104.26 |
| 4,830,100 A | * | 5/1989 | Kato et al. | 165/104.14 |
| 5,076,351 A | * | 12/1991 | Munekawa et al. | 165/104.21 |
| 5,755,278 A | * | 5/1998 | Shinohara et al. | 165/104.33 |
| 6,164,368 A | * | 12/2000 | Furukawa et al. | 165/104.33 |
| 6,189,601 B1 | * | 2/2001 | Goodman et al. | 165/80.3 |
| 6,935,409 B1 | * | 8/2005 | Parish IV et al. | 165/80.3 |

* cited by examiner

*Primary Examiner*—Ljiljana Ciric
(74) *Attorney, Agent, or Firm*—Oblon, Spivak, McClelland, Maier & Neustadt, P.C.

(57) ABSTRACT

A heat sink has a panel body and a heat radiating portion. The panel body includes a working fluid circuit for circulating a working fluid in the panel body and has a heat receiving portion and a heat radiating portion substantially on the same plane. The heat radiating portion has an upper region and a lower region. The heat receiving portion is provided on a lateral side of the lower region of the heat radiating portion, and a plurality of radiating fins are provided on at least one surface of the heat radiating portion of the panel body. The working fluid circuit extends from the heat receiving portion to the lower region of the heat radiating portion and further to the upper region of the heat radiating portion, and the working fluid circuit in the lower region of the heat radiating portion has an average channel cross sectional area which is smaller than an average channel cross sectional area of the working fluid circuit in the heat receiving portion.

9 Claims, 8 Drawing Sheets

HEAT SINK, CONTROL DEVICE HAVING THE HEAT SINK AND MACHINE TOOL PROVIDED WITH THE DEVICE

CROSS REFERENCE TO RELATED APPLICATIONS

This application is an application filed under 35 U.S.C. 111(a) claiming the benefit pursuant to 35 U.S.C. 119(e)(1) of the filing date of Provisional Application No. 60/322,439 filed Sep. 17, 2001 pursuant to 35 U.S.C. 111(b).

TECHNICAL FIELD

The present invention relates to heat sinks, and more particularly to heat sinks of the heat pipe type suitable for cooling heat generating elements of control devices such as servoamplifiers for use in NC machine tools and like machine tools. The invention relates also to control devices equipped with the heat sink and machine tools provided with the device.

BACKGROUND ART

FIGS. 13 and 14 show a heat sink of the type mentioned already known which comprises a main body 102 in the form of a vertical plate and having a heat receiving portion 103 for receiving the heat from a heat generating element and a heat radiating portion 104 integral with a lateral side of the heat receiving portion 103 and having an upper end projecting upward beyond the upper end of the heat receiving portion 103, and radiator fins 105 provided on one or each of opposite surfaces of the heat radiating portion 104. The heat sink main body 102 has a heat pipe portion 106 comprising a working fluid circuit 161 extending from the portion 103 to a lower region 104a of the heat radiating portion at the lateral side of the portion 103 and further to an upper region 104b of the heat radiating portion which region 104b is positioned at a higher level than the heat receiving portion 103, the circuit 161 having a working fluid (not shown) enclosed therein (see the publication of JP-A No. 8-186210).

The working fluid circuit 161 of the heat sink 101 described has, for example, a pattern as shown in FIG. 14 and has substantially the same channel cross sectional area from portion to portion. The working fluid in a working fluid circuit portion 161B provided in the heat receiving portion 103 evaporates to a gas by receiving the heat emitted by the heat generating element. The gaseous working fluid flows through part of a working fluid circuit portion 161A provided in the heat radiating portion lower region 104a into a working fluid circuit portion 161C in the heat radiating portion upper region 104b, in which the fluid is subjected to heat exchange with air through the radiating fins 105, whereby the fluid is converted to a liquid on condensation. The liquid of working fluid flows through other part of the circuit portion 161A in the lower region 104a under gravity and returns to the circuit portion 161B in the heat receiving portion 103. In the case of the heat sink 101 described, however, the liquid of working fluid remains also in the circuit portion 161A in the lower region 104a because of structural reasons.

Even when the circuit portion 161A in the heat radiating portion lower region 104a permits the liquid of working fluid to remain therein locally, the liquid retaining part contributes nothing to heat radiation and is therefore a structurally useless part. Additionally in order to maintain the liquid of working fluid at a predetermined level, there is a need to increase the amount of working fluid enclosed in the circuit by an amount corresponding to the quantity of the liquid working fluid remaining in the circuit portion 161A.

Further since the radiator fins 105 are provided substantially over the entire area of one or each of opposite surfaces of the heat radiating portion 104, fins 105 are present also in the lower region 104a. Nevertheless, the fins 105 provided in the lower region 104a contribute almost nothing to heat radiation and are structurally useless. The presence of useless fins conversely increases the pressure loss of the air flowing between the fins 105, consequently leading to impaired heat radiation performance.

For use in cooling the heat generating elements, for example, of control devices of machine tools, an object of the present invention is to provide a heat sink of the heat pipe type which is free of problems such as the useless structural portion due to the stagnation of liquid working fluid that would occur in the working fluid circuit portion in the heat radiating portion lower region, an increase in the amount of working fluid enclosed in the circuit and an increased pressure loss of air and which exhibits high performance at a lower cost.

DISCLOSURE OF THE INVENTION

The present invention provides a first heat sink comprising a heat sink main body in the form of a vertical plate and having a heat receiving portion and a heat radiating portion integral with a lateral side of the heat receiving portion and having an upper end projecting upward beyond an upper end of the heat receiving portion, and radiating fins provided on at least one surface of the heat radiating portion, the heat sink main body having a heat pipe portion comprising a working fluid circuit extending from the heat receiving portion to a lower region of the heat radiating portion at the lateral side of the heat receiving portion and further to an upper region of the heat radiating portion which region is positioned at a higher level than the heat receiving portion, the working fluid circuit having a working fluid enclosed therein, the heat sink being characterized in that the portion of the working fluid circuit provided in the lower region of the heat radiating portion is smaller than the portion of the working fluid circuit provided in the heat receiving portion in average channel cross sectional area.

Thus, the circuit portion provided in the lower region is smaller than the circuit portion provided in the heat receiving portion in average channel cross sectional area. The amount of the working fluid in a liquid state and remaining in the former circuit portion is then smaller than in the prior art. This diminishes the structurally useless portion of the sink, consequently serving to reduce the amount of working fluid to be enclosed in the circuit.

In the first heat sink of the invention, the circuit portion provided in the lower region of the heat radiating portion may have a bottom positioned at a higher level than a bottom of the circuit portion provided in the heat receiving portion.

When the bottom of the circuit portion in the lower region is thus positioned at a higher level than the bottom of the circuit portion of the heat receiving portion, the working fluid in the liquid state and remaining in the former circuit portion further diminishes, with the result that the advantage described above is available more effectively.

In the first heat sink, the circuit portion provided in the lower region of the heat radiating portion may have a bottom sloping downward toward the heat receiving portion.

When the bottom of the circuit portion in the lower region thus slopes downward toward the heat receiving portion, the amount of liquid working fluid remaining in the circuit portion becomes further smaller, whereby the above advantages becomes greater. This further enables the liquid working fluid to flow from the circuit portion in the lower region to the circuit portion in the heat receiving portion more rapidly.

The present invention provides a second heat sink comprising a heat sink main body in the form of a vertical plate and having a heat receiving portion and a heat radiating portion integral with a lateral side of the heat receiving portion and having an upper end projecting upward beyond an upper end of the heat receiving portion, and radiating fins provided on at least one surface of the heat radiating portion, the heat sink main body having a heat pipe portion comprising a working fluid circuit extending from the heat receiving portion to a lower region of the heat radiating portion at the lateral side of the heat receiving portion and further to an upper region of the heat radiating portion which region is positioned at a higher level than the heat receiving portion, the working fluid circuit having a working fluid enclosed therein, the heat sink being characterized in that the radiating fins each have a lower end positioned at a higher level than a lower end of the lower region of the heat radiating portion and at the same level as or a lower level than an upper end of the lower region.

When the lower ends of the radiating fins are thus positioned at a level higher than the lower end of the lower region and at the same level as or a lower level than the upper end of the lower region, no radiating fins will be present at at least a lower part in the lower region having the circuit portion not contributing to heat radiation. This diminishes the structurally useless portion to result in a reduced cost, also contributing to a reduction in the weight of the heat sink. The pressure loss of the air flowing between the radiating fins can further be reduced to thereby achieve improved heat radiation performance. With a reduction in the air pressure loss, the fin pitch of radiating fins can be smaller than in the prior art to thereby achieve a further improvement in heat radiation performance.

The present invention further provides a third heat sink comprising a heat sink main body in the form of a vertical plate and having a heat receiving portion and a heat radiating portion integral with a lateral side of the heat receiving portion and having an upper end projecting upward beyond an upper end of the heat receiving portion, and radiating fins provided on at least one surface of the heat radiating portion, the heat sink main body having a heat pipe portion comprising a working fluid circuit extending from the heat receiving portion to a lower region of the heat radiating portion at the lateral side of the heat receiving portion and further to an upper region of the heat radiating portion which region is positioned at a higher level than the heat receiving portion, the working fluid circuit having a working fluid enclosed therein, the heat sink being characterized in that the fin pitch of the radiating fins in the lower region of the heat radiating portion is greater than the fin pitch of the radiating fins in the upper region thereof.

The fin pitch of the radiating fins in the lower region is thus made greater than the fin pitch of the radiating fins in the upper region. This reduces the heat radiating area of the radiating fins present in the lower region having the circuit portion not contributing to heat radiation, consequently diminishing the structurally useless portion to result in a reduced cost and also contributing to a reduction in the weight of the heat sink. The pressure loss of the air flowing between the radiating fins can further be reduced to thereby achieve improved heat radiation performance.

In the third heat sink of the invention, the height of the radiating fins in the lower region of the heat radiating portion may be lower than the height of the radiating fins in the upper region thereof.

In addition to the above fin pitch, the height of the radiating fins in the lower region is made lower than the height of the radiating fins in the upper region. This further reduces the heat radiating area of the radiating fins present in the lower region having the circuit portion not contributing to heat radiation. The advantage described therefore becomes greater.

The present invention further provides a fourth heat sink comprising a heat sink main body in the form of a vertical plate and having a heat receiving portion and a heat radiating portion integral with a lateral side of the heat receiving portion and having an upper end projecting upward beyond an upper end of the heat receiving portion, and radiating fins provided on at least one surface of the heat radiating portion, the heat sink main body having a heat pipe portion comprising a working fluid circuit extending from the heat receiving portion to a lower region of the heat radiating portion at the lateral side of the heat receiving portion and further to an upper region of the heat radiating portion which region is positioned at a higher level than the heat receiving portion, the working fluid circuit having a working fluid enclosed therein, the heat sink being characterized in that the height of the radiating fins in the lower region of the heat radiating portion is lower than the height of the radiating fins in the upper region thereof.

If the height of the radiating fins in the lower region is thus made lower than the height of the radiating fins in the upper region, a further reduction can be made in the heat radiating area of the radiating fins present in the lower region having the circuit portion not contributing to heat radiation, consequently diminishing the structurally useless portion to result in a reduced cost and also contributing to a reduction in the weight of the heat sink. The pressure loss of the air flowing between the radiating fins can further be reduced to thereby achieve improved heat radiation performance.

In the first to fourth heat sinks of the invention, the heat sink main body may be provided by a roll-bonded panel, with the working fluid circuit comprising a tubular protuberant portion so formed as to bulge out toward at least one side of the panel. Alternatively the heat sink main body may comprise a clad sheet formed by joining two metal sheets to each other, and a circuit forming recess may be formed in at least one of the metal sheets in a surface thereof to be joined to the other metal sheet. However, the construction of the heat sink main body is not limited to those described above.

In the first to fourth heat sinks of the invention, a fin unit made of a metal extrudate comprises a flat platelike base joined to at least one surface of the heat radiating portion, and a plurality of fin portions formed on an outer surface of the base integrally with the base, the fin portions providing the radiating fins. Alternatively, the radiating fins are provided by a corrugated fin member joined to at least one surface of the heat radiating portion directly or with a flat platelike base interposed therebetween. However, the radiating fins are not limited to those described above in construction.

The present invention includes a control device having one of the heat sinks described above and characterized in that the device comprises a heat generating element, the heat sink being attached to the device so as to receive by the heat receiving portion thereof the heat produced by the heat generating element. The control device is, for example, a servoamplifier provided, for example, with a thyristor, transistor or like heat generating element.

The present invention further includes a machine tool characterized in that the tool comprises the control device of the invention. The machine tool is, for example, an NC machine tool.

BEST MODE OF CARRYING OUT THE INVENTION

Figure 1:
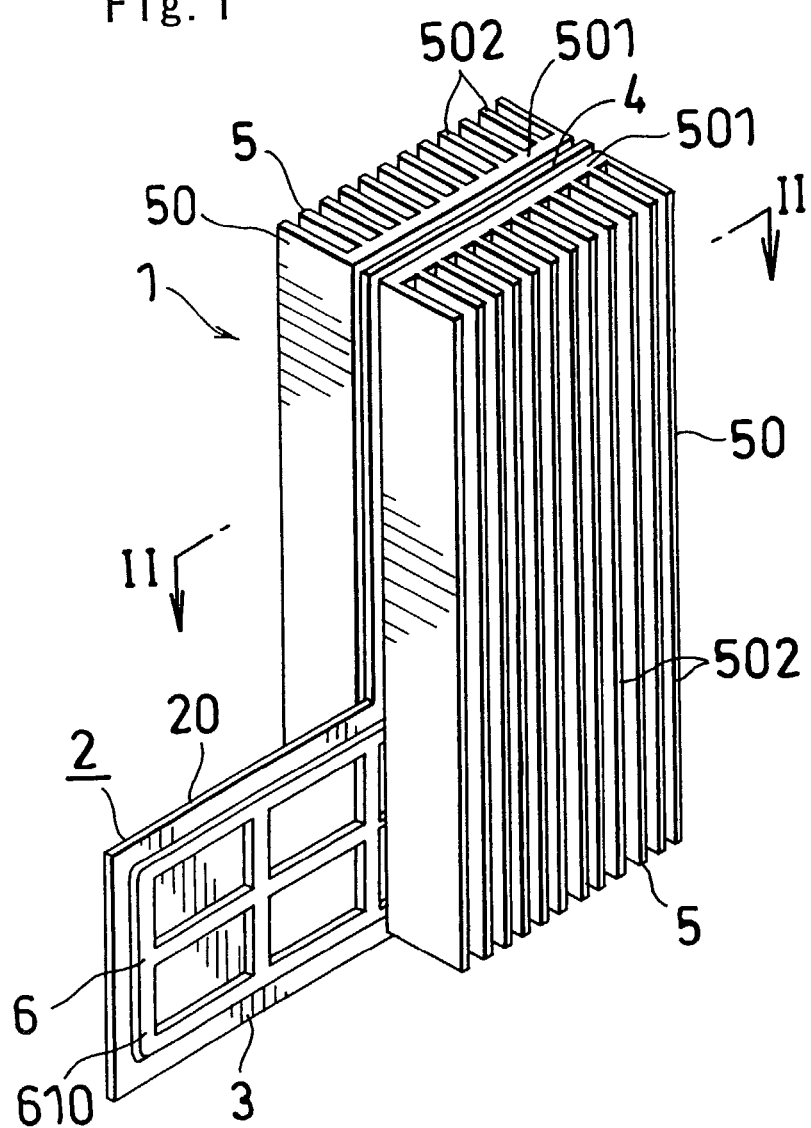
FIG. 1 is a perspective view showing a heat sink of first embodiment of the invention as it is seen from above.
Figure 2:
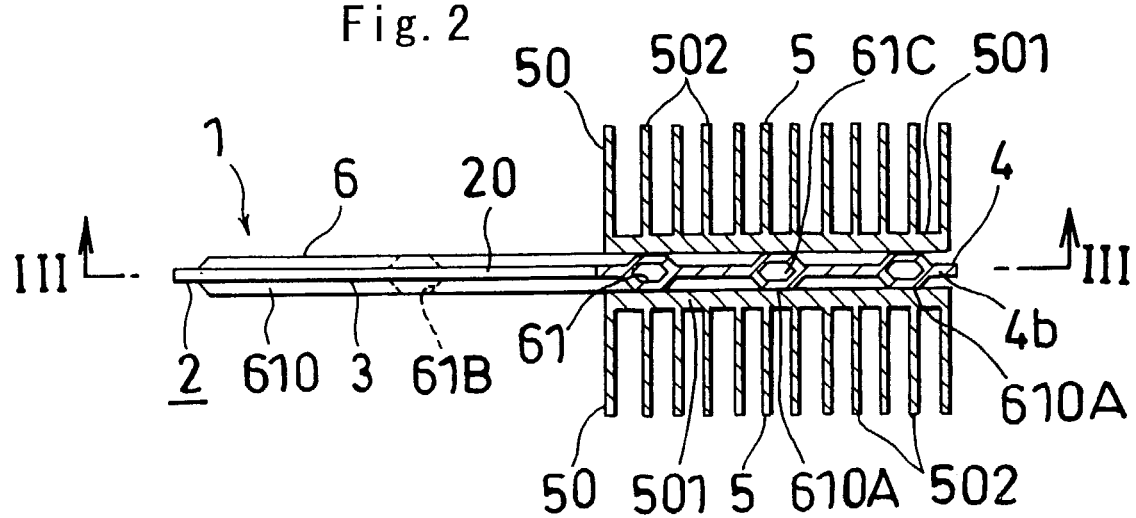
FIG. 2 is a view of the heat sink in horizontal section along the line II—II in FIG. 1.
Figure 3:
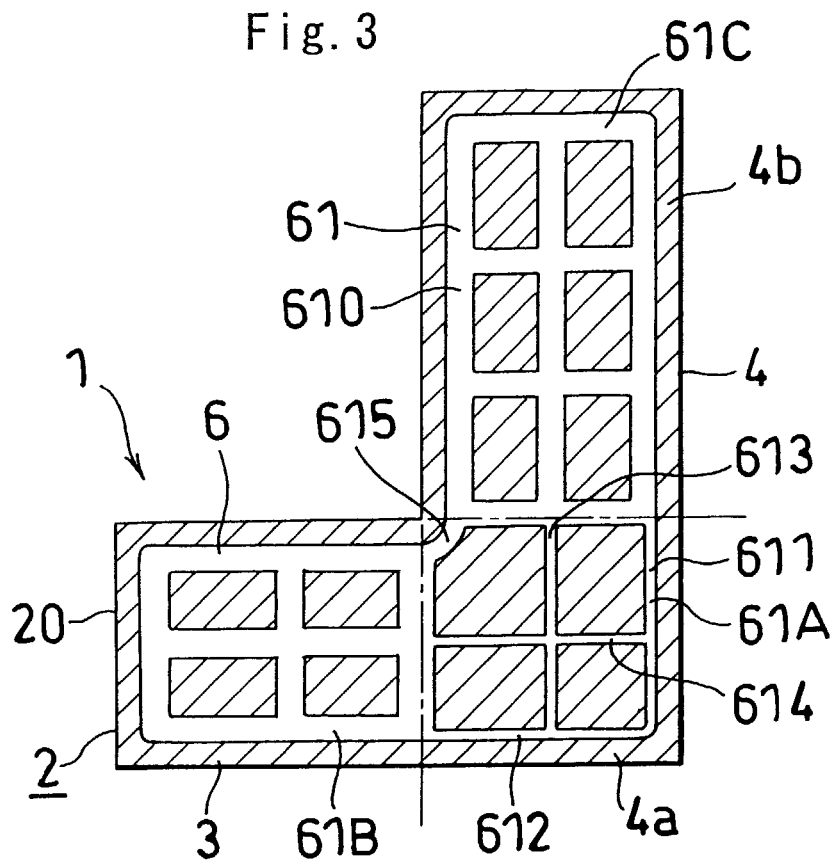
FIG. 3 is a view of the heat sink in vertical section along the line III—III in FIG. 2.

FIGS. 1 to 4 show a first embodiment of the invention. With reference to FIGS. 1 to 3, a heat sink 1 of the invention comprises a heat sink main body 2 in the form of a vertical plate and having a heat receiving portion 3 and a heat radiating portion 4 integral with a lateral side of the heat receiving portion 3 and having an upper end projecting upward beyond the upper end of the portion 3, and radiating fins 5 provided on each of opposite surfaces of the heat radiating portion 4. The heat sink main body 2 has a heat pipe portion 6 which is formed by providing a working fluid circuit 61 extending from the heat receiving portion 3 to a lower region 4a of the heat radiating portion at the lateral side of the heat receiving portion 3 and further to an upper region 4b of the heat radiating portion which region 4b is positioned at a higher level than the heat receiving portion 3 and enclosing a working fluid (not shown) in the circuit 61. The portion 61A of the working fluid circuit provided in the lower region 4a of the heat radiating portion is smaller than the portion 61B of the circuit provided in the heat receiving portion 3 in average channel cross sectional area. The heat sink main body 2 is provided by a roll-bonded panel 20. The working fluid circuit 61 comprises a tubular protuberant portion 610 so formed as to bulge out toward opposite sides of the panel 20. Each of two fin units 50 is made of an aluminum (including an aluminum alloy, the same as hereinafter) extrudate and comprises a flat platelike base 501, and a plurality of fin portions 502 formed on the outer surface of the base 501 integrally therewith. The bases 501 of the two units 50 are joined respectively to the opposite surfaces of the heat radiating portion 3. The fin portions 502 provide the radiating fins 5.

As shown in FIG. 3, the heat sink main body 2 has an L-shape as laterally reversed. The square portion projecting leftward in FIG. 3 serves as the heat receiving portion 3, and the remaining vertically elongated rectangular portion as the heat radiating portion 4. The working fluid circuit 61 is provided approximately over the entire area of the heat sink main body 2 and has a lattice pattern as shown in FIG. 3. The circuit 61 is generally hexagonal in channel cross section as seen in FIG. 2. The portions of the main body 2 bulging out toward the opposite sides each have a flat face 610A to be joined to the base 501 of the fin unit 50. The circuit portion 61A in the heat radiating portion lower region 4a is provided approximately at the same level as the circuit portion 61B in the heat receiving portion 3. Accordingly, the working fluid in the form of a liquid and in circulation remains in this portion 61A during the operation of the heat pipe portion 6. The liquid working fluid in the circuit portion 61A in the lower region 4a flows in the largest amount through a vertical channel 611 positioned at the right end in FIG. 3 and through a horizontal channel 612 at the lowermost level, and in the second largest amount through a vertical channel 613 at the left of the vertical channel 611 adjacent thereto and through a horizontal channel 614 above the horizontal channel 612. A gas of working fluid flowing from the circuit portion 61B of the heat receiving portion 3 toward the circuit portion 61C in the heat radiating portion upper region 4b mainly flows through a curved channel 615 positioned at the left upper portion of the lower region 4a. Almost no liquid working fluid flows through the curved channel 615. The two vertical channels 611, 613 and the two horizontal channels 612, 614 which serve substantially as circulation channels for the liquid working fluid are made smaller than the channels constituting the circuit portion 61B of the heat receiving portion 3 in cross sectional area as shown in FIG. 3, with the result that the circuit portion 61A in the heat radiating portion lower region 4a is smaller than the circuit portion 61B of the heat receiving portion 3 in average channel cross sectional area.

The base 501 of the fin unit 50 has approximately the same size as the heat radiating portion 4 of the heat sink main body 2. The fin portions 502 are each in the form of a plate projecting from the outer surface of the base 501 perpendicular thereto and extending vertically. The fin portions 502 are arranged in parallel widthwise of the base 501 at a predetermined spacing. The base 501 of the fin unit 50 is joined to the heat radiating portion 4 of the heat sink main body 2 usually by brazing.

Figure 4:
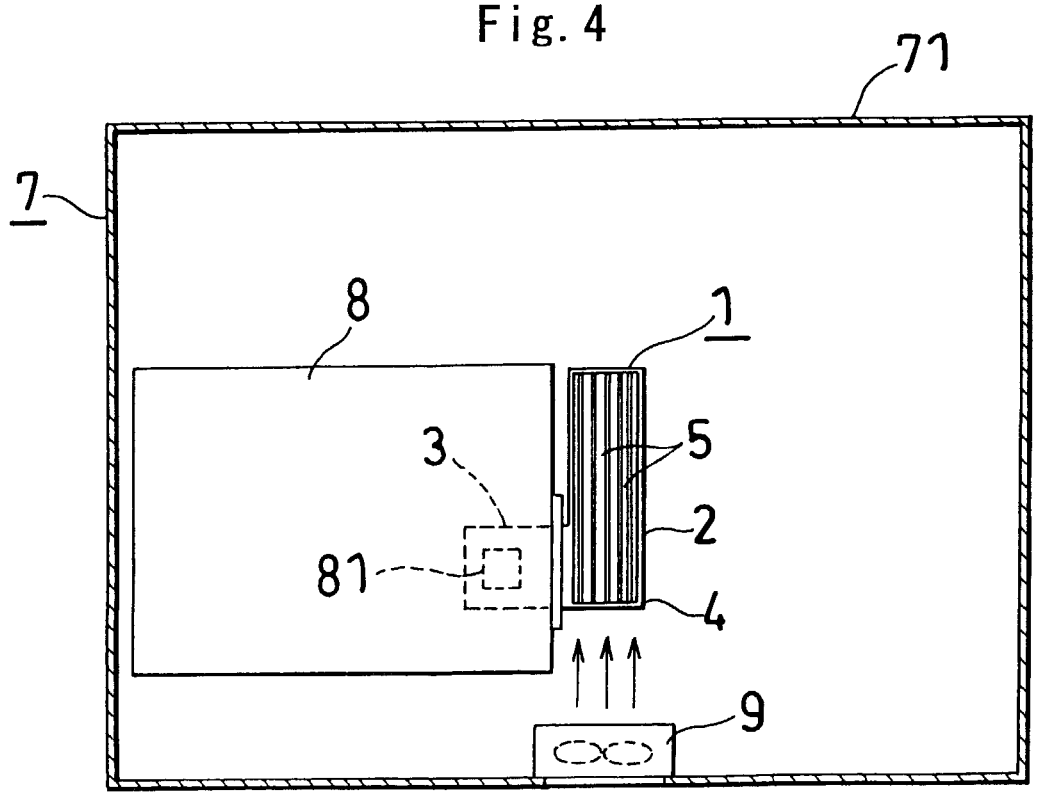
FIG. 4 is a view in vertical section and schematically showing an NC machine tool equipped with a servoamplifier which has the heat sink of FIG. 1 attached thereto.

FIG. 4 shows the heat sink 1 as attached to a servoamplifier 8 of an NC machine tool 7. The servoamplifier 8 internally has a thyristor or like heat generating element 81 and is disposed within a casing 71 of the NC machine tool 7. The heat sink 1 is attached to the servoamplifier 8 so that the heat receiving portion 3 of the main body 2 can receive the heat emitted by the heat generating element 81. The heat radiating portion 4 of the heat sink main body 2 and the radiating fins 5 are positioned outside the servoamplifier 8. The radiating fins 5 are exposed to an air stream from a fan 9 disposed therebelow.

A large quantity of heat emitted by the heat generating element 81 with the operation of the servoamplifier 8 is transmitted to the heat receiving portion 3 of the heat sink main body 2. The liquid working fluid in the circuit portion 61B provided in the heat receiving portion 3 is evaporated into a gas with the heat. The gas of working fluid flows through part of the circuit portion 61A provided in the heat radiating portion lower region 4a to the circuit portion 61C provided in the heat radiating portion upper region 4b and is subjected to heat exchange with air in the portion 61C through the radiating fins 5, whereby the gas is converted to a liquid on condensation. The liquid of working fluid flows down under gravity, remains in other part of the circuit portion 61A in the lower region 4a and is thereafter returned to the circuit portion 61B of the heat receiving portion 3.

Figure 13:
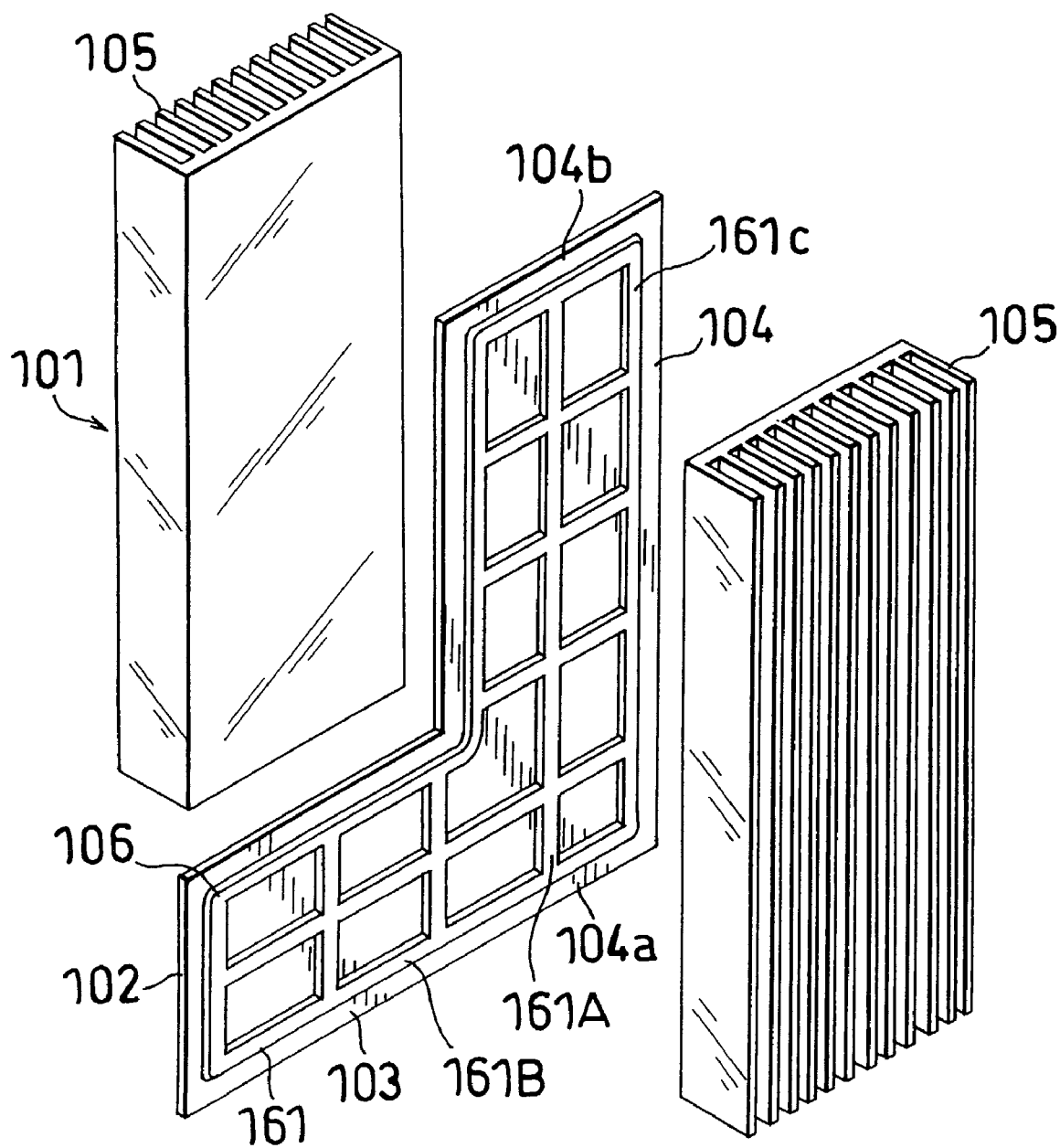
FIG. 13 is an exploded perspective view of a conventional heat sink as it is seen from above.
Figure 14:
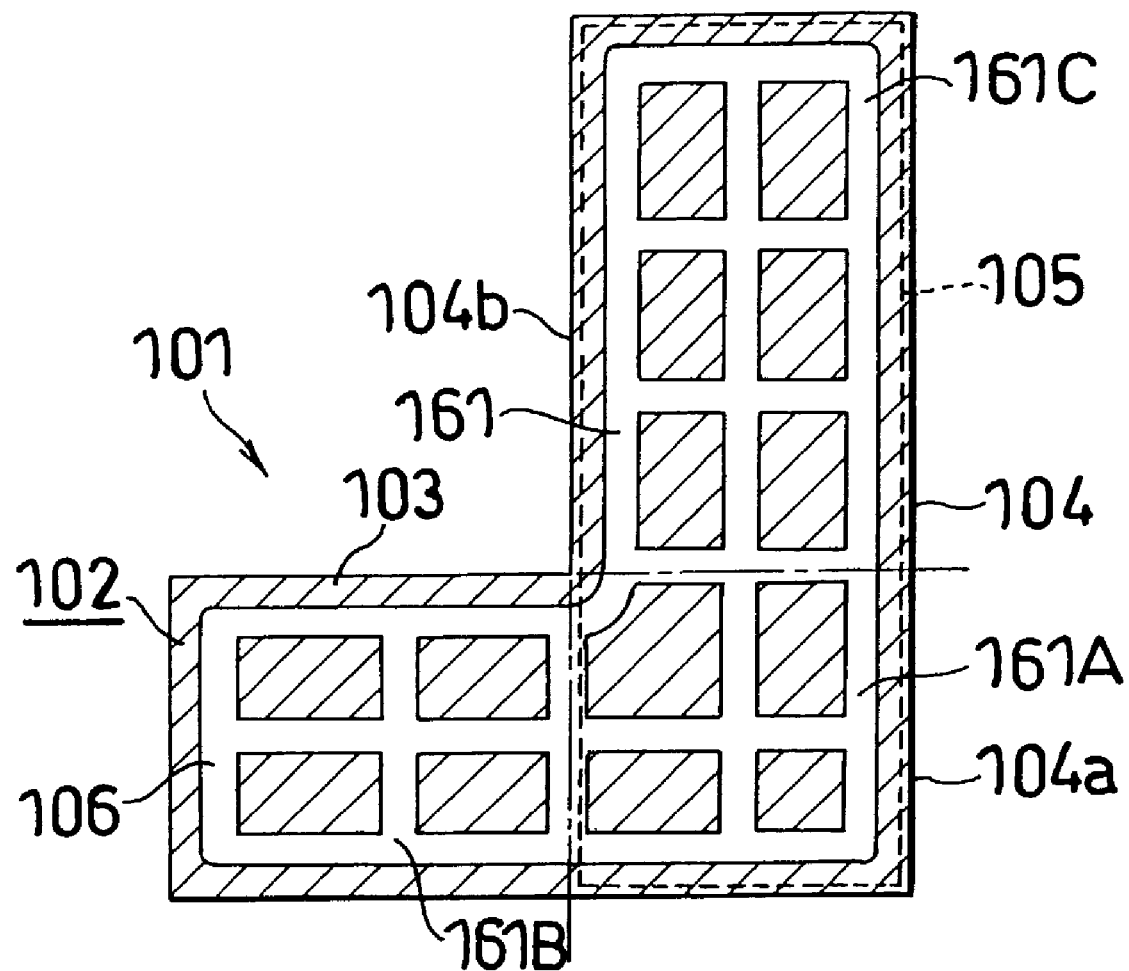
FIG. 14 is a view in vertical section and showing the conventional heat sink.

In the case of the heat sink 1 according to the invention, the circuit portion 61A in the lower region 4a is smaller than the circuit portion 61B of the heat receiving portion 3 in average channel cross sectional area as described above, so that the amount of the liquid working fluid remaining in the former circuit portion 61A is smaller than in the prior art shown in FIGS. 13 and 14. Accordingly, the heat sink 1 is diminished in structural useless portion, consequently reducing the amount of working fluid to be enclosed in the circuit 61.

Figure 5:
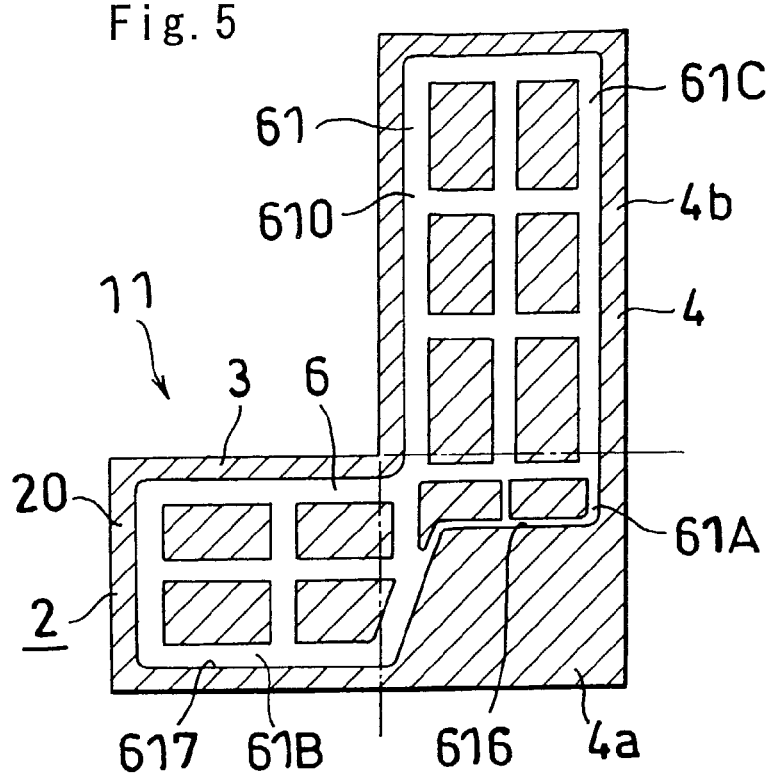
FIG. 5 is a view in vertical section, corresponding to FIG. 3 and showing a heat sink of second embodiment of the invention.

FIG. 5 shows a second embodiment of the invention, i.e., a heat sink 11, wherein the portion 61A of the working fluid circuit provided in the heat radiating portion lower region 4a has a bottom 616 positioned at a higher level than the bottom 617 of the portion 61B of the working fluid provided in the heat receiving portion 3 as shown in FIG. 5. With this heat sink 11, the amount of liquid working fluid remaining in the former circuit portion 61A can be further smaller, so that the advantage described with reference to the first embodiment is available more effectively.

Figure 6:
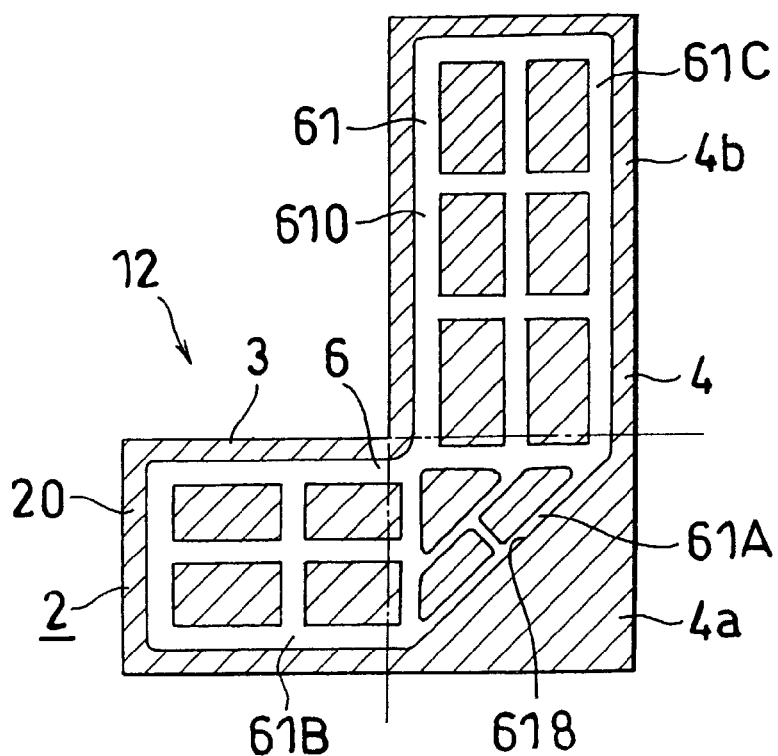
FIG. 6 is a view in vertical section, corresponding to FIG. 3 and showing a heat sink of third embodiment of the invention.

FIG. 6 shows a third embodiment of the invention, i.e., a heat sink 12, wherein the working fluid circuit portion 61A provided in the heat radiating portion lower region 4a has a bottom 618 sloping downward toward the heat receiving portion 3 as shown in FIG. 6. With this heat sink 12, the amount of liquid working fluid remaining in the former circuit portion 61A can be further smaller, so that the advantage described with reference to the first embodiment is available more effectively. Further in the case of this heat sink 12, the liquid of working fluid returns from the circuit portion 61A in the lower region 4a to the circuit portion 61B of the heat receiving portion 3 more rapidly.

Figure 7:
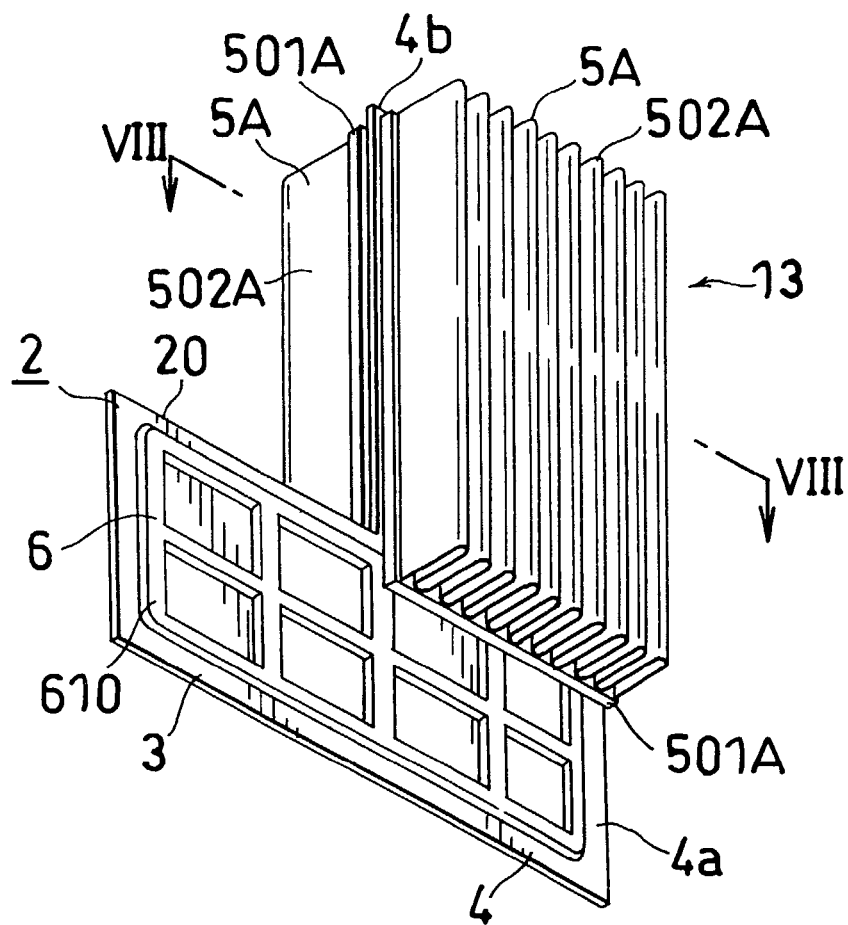
FIG. 7 is a perspective view showing a heat sink of fourth embodiment of the invention as it is seen from below.
Figure 8:
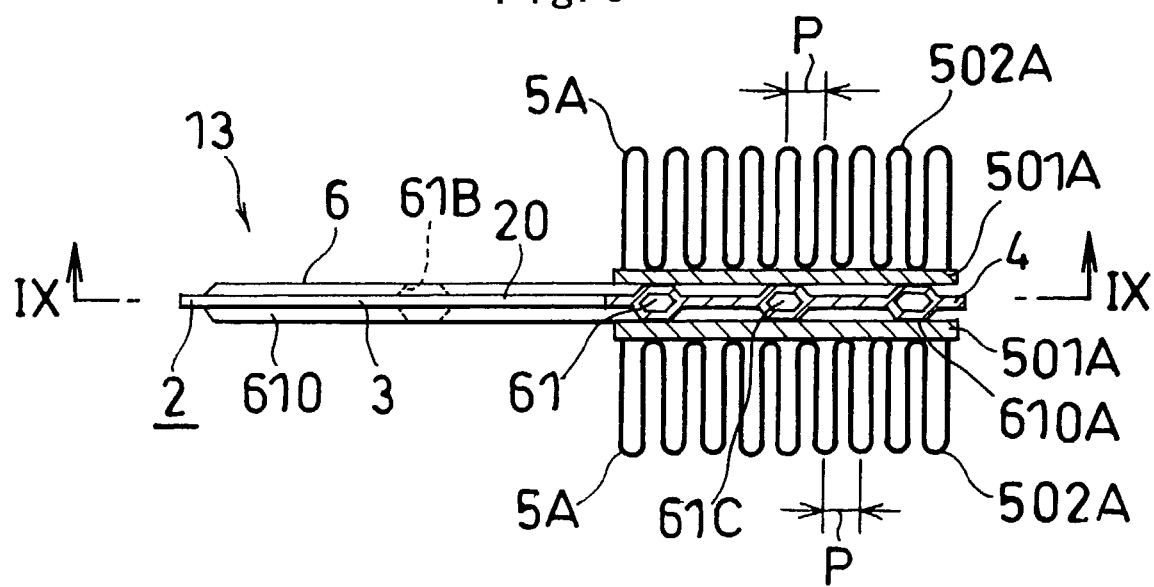
FIG. 8 is a view of the heat sink in horizontal section along the line VIII—VIII in FIG. 7.
Figure 9:
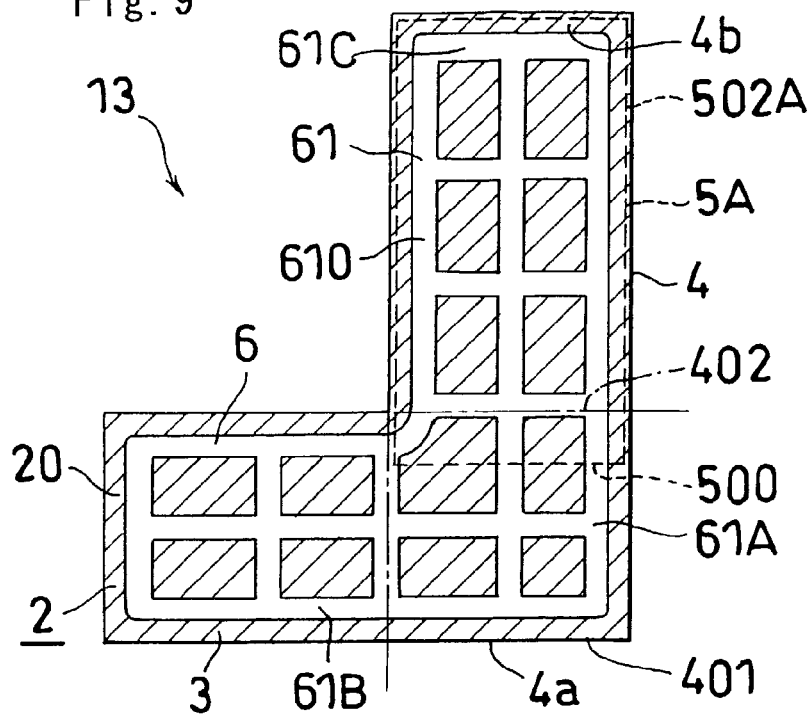
FIG. 9 is a view of the heat sink in vertical section along the line IX—IX in FIG. 8.

FIGS. 7 to 9 show a fourth embodiment of the invention. These drawings show a heat sink 13, which comprises a heat sink main body 2 in the form of a vertical plate and having a heat receiving portion 3 and a heat radiating portion 4 integral with a lateral side of the heat receiving portion 3 and having an upper end projecting upward beyond the upper end of the portion 3, and radiating fins 5A provided on each of opposite surfaces of the heat radiating portion 4. The heat sink main body 2 has a heat pipe portion 6 which is formed by providing a working fluid circuit 61 extending from the heat receiving portion 3 to a lower region 4a of the heat radiating portion at the lateral side of the heat receiving portion 3 and further to an upper region 4b of the heat radiating portion which region 4b is positioned at a higher level than the heat receiving portion 3 and enclosing a working fluid (not shown) in the circuit 61. As shown in FIG. 9, the radiating fins 5A each have a lower end 500 positioned at a higher level than the lower end 401 of the radiating portion lower region 4a and at a lower level than the upper end 402 of the region 4a.

The heat sink main body 2 has basically the same construction as the main body 2 of the heat sink 1 shown in FIGS. 1 to 3, while the working fluid circuit 61 is substantially the same as the circuit of the conventional heat sink shown in FIGS. 13 and 14 (see FIG. 9). The circuit 61 of the present embodiment can be of the same construction as the circuit 61 of the heat sink 1, 11 or 12 shown in FIGS. 1 to 3, 5 or 6.

The radiating fins 5A is provided by a corrugated fin member 502A joined to the surface of the heat radiating portion 4 of the main body 2 with a flat platelike base member 501A interposed therebetween. The base member 501A is joined to the radiating portion 4 of the main body 2, and the fin member 502A to the base member 501A, usually by brazing. The base member 501A is provided, for example, by a brazing sheet comprising an aluminum sheet clad with a brazing material on each surface thereof. The fin member 502A is provided, for example, by an aluminum sheet corrugated by roll forming. The corrugated fin member 502A has its furrow portions joined to the outer surface of the base member 501A, with the ridges and furrows thereof arranged alternately in a horizontal direction.

The heat sink 13, like the one shown in FIG. 4, is attached, for example, to a servoamplifier of an NC machine tool and used for cooling a thyristor or like heat generating element in the servoamplifier.

In the case of the heat sink 13 of the present embodiment, the lower ends 500 of the radiating fins 5A are positioned at a higher level than the lower end 401 of the lower region 4a and a lower level than the upper end 402 of the region 4a, so that the sink is diminished in structural useless portion and available at a reduced cost unlike the conventional one shown in FIGS. 13 and 14. The construction also contributes to a reduction in weight and decreases the pressure loss of the air flowing between the radiating fins 5A. With the air pressure loss reduced, the pitch P of radiating fins 5A can be smaller than in the prior art. This also achieves a further improvement in heat radiation performance.

Figure 10:
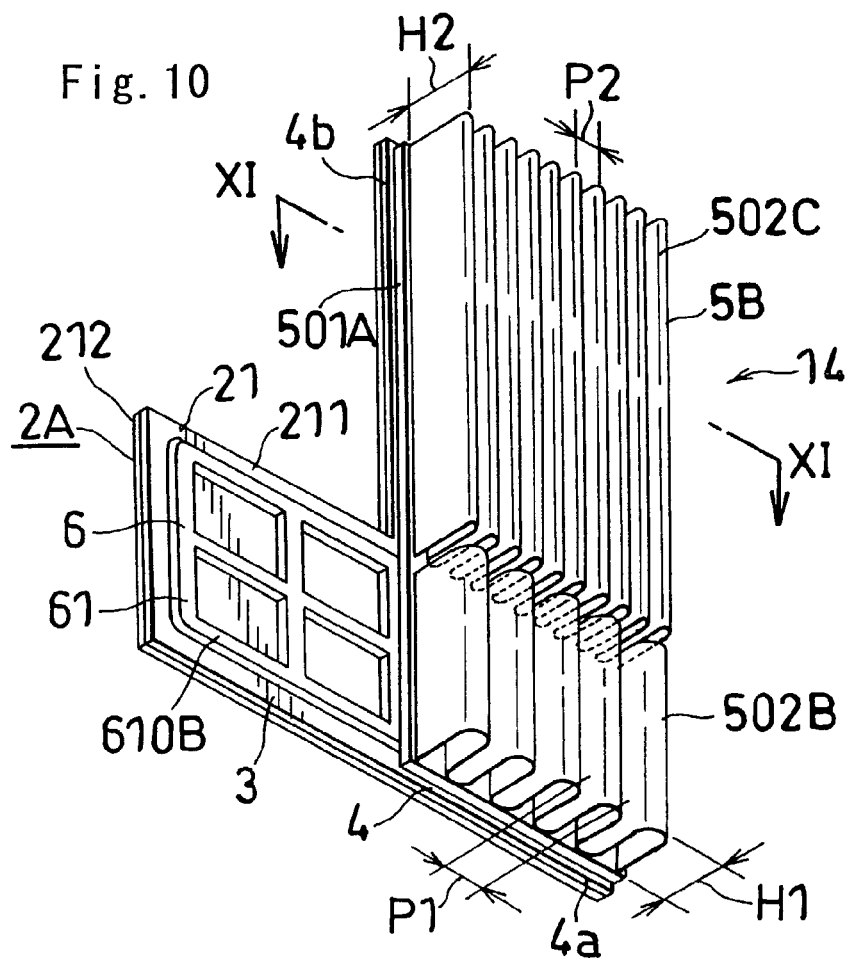
FIG. 10 is a perspective view showing a heat sink of fifth embodiment of the invention as it is seen from below.
Figure 11:
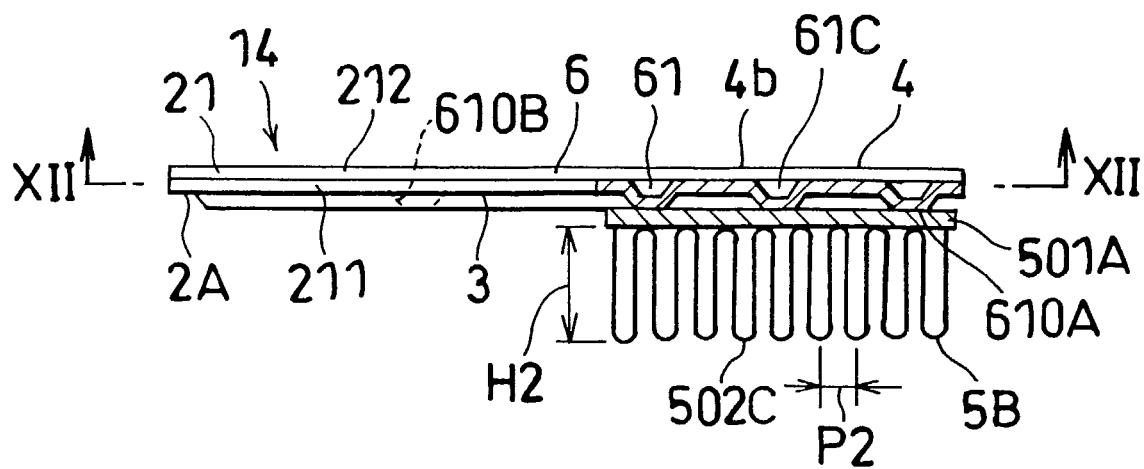
FIG. 11 is a view of the heat sink in horizontal section along the line XI—XI in FIG. 10.
Figure 12:
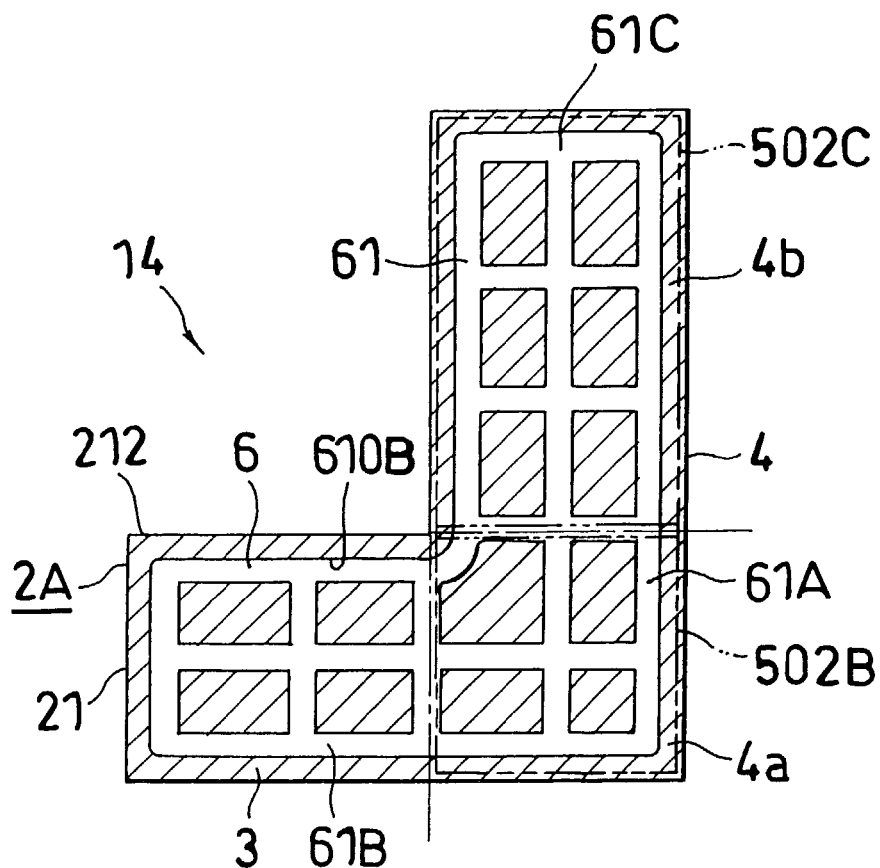
FIG. 12 is a view of the heat sink in vertical section along the line XII—XII in FIG. 11.

FIGS. 10 to 12 show a fifth embodiment of the invention. These drawings show a heat sink 14 which comprises a heat sink main body 2A in the form of a vertical plate and having a heat receiving portion 3 and a heat radiating portion 4 integral with a lateral side of the heat receiving portion 3 and having an upper end projecting upward beyond the upper end of the portion 3, and radiating fins 5B provided on one surface of the heat radiating portion 4. The heat sink main body 2A has a heat pipe portion 6 which is formed by providing a working fluid circuit 61 extending from the heat receiving portion 3 to a lower region 4a of the heat radiating portion at the lateral side of the heat receiving portion 3 and further to an upper region 4b of the heat radiating portion which region 4b is positioned at a higher level than the heat receiving portion 3 and enclosing a working fluid (not shown) in the circuit 61. As shown in FIG. 10, the fin pitch P1 of the radiating fins 5B in the lower region 4a of the heat radiating portion is greater than the fin pitch P2 of the radiating fins 5B in the upper region 4b thereof. The height H1 of the radiating fins 5B in the lower region 4a of the heat radiating portion is lower than the height H2 of the radiating fins 5B in the upper region 4b thereof.

As shown in FIG. 11, the heat sink main body 2A comprises a clad sheet 21 formed by joining two metal sheets 211, 212 to each other, and circuit forming recesses 610B are formed in one of the metal sheets, 211, in the surface thereof to be joined to the other metal sheet. The metal sheets 211, 212 each comprise, for example, an aluminum sheet. The recesses 610B are formed in one of the aluminum sheets as by press work. The two metal plates 211, 212 are joined to each other, for example, by brazing or welding. The working fluid circuit 61 of the heat sink main body 2A is substantially the same as the circuit of the conventional heat sink shown in FIGS. 13 and 14 (see FIG. 12). The circuit 61 of the present embodiment can be of the same construction as the circuit 61 of the heat sink 1, 11 or 12 shown in FIGS. 1 to 3, 5 or 6. The channels of the fluid circuit 61 are generally trapezoidal in cross section as shown in FIG. 11. The bottoms of the circuit forming recesses in the metal plate 211 have flat surfaces 610A for joining a base member 501A thereto. The heat sink main body can be provided by a clad sheet comprising at least three metal sheets which are joined. In this case, circuit forming cutouts are formed in the intermediate metal sheet, and inner fin members for forming a working fluid circuit are provided in the respective cutouts to form the circuit in the heat sink main body.

The radiating fins 5B are provided by upper and lower two corrugated fin members 502B, 502C joined to one surface of the heat radiating portion 4 of the main body 2A, with a flat platelike base member 501A interposed therebetween. The base member 501A is joined to the radiating portion 4 of the main body 2A, and the fin members 502B, 502C to the base member 501A, usually by brazing. The base member 501A is provided, for example, by a brazing sheet comprising an aluminum sheet clad with a brazing material on each surface thereof, and has approximately the same size as the heat radiating portion 4 of the main body 2A. The fin members 502B, 502C are each provided, for example, by an aluminum sheet corrugated by roll forming. Each of the fin members 502B, 502C has its furrow portions joined to the outer surface of the base member 501A, with the ridges and furrows thereof arranged alternately in a horizontal direction. The lower fin member 502B is joined to the outer surface of the base member 501A over the portion thereof corresponding to the heat radiating portion lower region 4a, and the upper fin member 502C to the base member portion corresponding to the upper region 4b. The fin pitch P1 of the lower fin member 502B is greater than the fin pitch P2 of the upper fin member 502C. The fin height H1 of the lower fin member 502B is lower than the fin height H2 of the upper fin member 502C.

The heat sink 14, like the one shown in FIG. 4, is attached, for example, to a servoamplifier of an NC machine tool and used for cooling a thyristor or like heat generating element in the servoamplifier.

In the case of the heat sink 14 of the present embodiment, the fin pitch P1 of the radiating fins 5B in the lower region 4a of the heat radiating portion is greater than the fin pitch P2 of the radiating fins 5B in the upper region 4b thereof. The height H1 of the radiating fins 5B in the lower region 4a of the heat radiating portion is lower than the height H2 of the radiating fins 5B in the upper region 4b thereof as described above. Unlike the heat sink of the prior art shown in FIGS. 13 and 14, therefore, the heat sink 14 is diminished in structural useless portion and available at a reduced cost, and the construction contributes to a reduction in weight. Further it is possible to decrease the pressure loss of the air flowing between the radiating fins 5B. This also achieves a further improvement in heat radiation performance.

The foregoing embodiments are given for illustrative purposes only. The invention can of course be practiced as suitably modified without departing from the scope of the invention set forth in the appended claims.

The invention claimed is:

1. A heat sink comprising:
a panel body including a working fluid circuit configured to circulate a working fluid in the panel body, the panel body having a heat receiving portion and a heat radiating portion substantially on the same plane, the heat radiating portion having an upper region and a lower region, and the heat receiving portion being provided on a lateral side of the lower region of the heat radiating portion; and
a plurality of radiating fins provided on at least one surface of the heat radiating portion of the panel body,
wherein the working fluid circuit extends from the heat receiving portion to the lower region of the heat radiating portion and further to the upper region of the heat radiating portion, and the working fluid circuit in the lower region of the heat radiating portion has an average channel cross sectional area which is smaller than an average channel cross sectional area of the working fluid circuit in the heat receiving portion.

2. A heat sink according to claim 1, wherein the panel body comprises a roll-bonded panel, and the working fluid circuit comprises a tubular protuberant portion which bulges out toward at least one side of the roll-bonded panel.

3. A heat sink according to claim 1, wherein the plurality of fins comprises a metal and has a plurality of fin portions integrally formed on a flat base joined to at least one surface of the heat radiating portion.

4. A heat sink according to claim 1, wherein the working fluid circuit has a lattice pattern.

5. A heat sink according to claim 1, wherein the working fluid circuit has a grid pattern.

6. A heat sink according to claim 1, wherein the working fluid circuit includes a conduit having a hexagonal cross section.

7. A heat sink according to claim 1, wherein the working fluid circuit in the lower region of the heat radiating portion includes at least one portion sloping toward the heat receiving portion.

8. A control device comprising a heat sink including: a panel body including a working fluid circuit configured to circulate a working fluid in the panel body, the panel body having a heat receiving portion and a heat radiating portion substantially on the same plane, the heat radiating portion having an upper region and a lower region, and the heat receiving portion being provided on a lateral side of the lower region of the heat radiating portion; and a plurality of radiating fins provided on at least one surface of the heat radiating portion of the panel body, wherein the working fluid circuit extends from the heat receiving portion to the lower region of the heat radiating portion and further to the upper region of the heat radiating portion, and the working fluid circuit in the lower region of the heat radiating portion has an average channel cross sectional area which is smaller than an average channel cross sectional area of the working fluid circuit in the heat receiving portion.

9. A machine tool comprising a heat sink including: a panel body including a working fluid circuit configured to circulate a working fluid in the panel body, the panel body having a heat receiving portion and a heat radiating portion substantially on the same plane, the heat radiating portion having an upper region and a lower region, and the heat receiving portion being provided on a lateral side of the lower region of the heat radiating portion; and a plurality of radiating fins provided on at least one surface of the heat radiating portion of the panel body, wherein the working fluid circuit extends from the heat receiving portion to the lower region of the heat radiating portion and further to the upper region of the heat radiating portion, and the working fluid circuit in the lower region of the heat radiating portion has an average channel cross sectional area which is smaller than an average channel cross sectional area of the working fluid circuit in the heat receiving portion.

* * * * *